United States Patent [19]
Beckwith et al.

[11] Patent Number: 5,780,771
[45] Date of Patent: Jul. 14, 1998

[54] HERMETICALLY SEALED HOUSING HAVING A FLEX TAPE ELECTRICAL CONNECTOR

[75] Inventors: Timothy A. Beckwith, Coon Rapids; Kathryn M. Lehmeier, St. Anthony, both of Minn.

[73] Assignee: Honeywell, Minneapolis, Minn.

[21] Appl. No.: 704,824

[22] Filed: Aug. 28, 1996

[51] Int. Cl.$^6$ ................................. H05K 5/06
[52] U.S. Cl. ................. 174/17.08; 174/50.52; 361/643
[58] Field of Search .................. 174/17.8, 17.05, 174/50.5, 50.52, 52.4, 117 F, 117 FF, 50.56, 50.62; 361/643; 375/259; 29/883; 277/178

[56] References Cited

U.S. PATENT DOCUMENTS

| | | |
|---|---|---|
| 4,009,848 | 3/1977 | Albert et al. . |
| 4,038,490 | 7/1977 | Miller et al. ............... 174/88 C |
| 4,192,965 | 3/1980 | Baum ........................ 174/135 |
| 4,266,266 | 5/1981 | Sanner ....................... 361/643 |
| 4,547,624 | 10/1985 | Tower et al. ............... 174/52 FP |
| 4,711,125 | 12/1987 | Morrison . |
| 4,764,939 | 8/1988 | Rogers ....................... 375/259 |
| 4,857,673 | 8/1989 | Wilkus et al. ............. 174/110 PM |
| 5,071,143 | 12/1991 | Byerly et al. ............... 277/178 |
| 5,168,683 | 12/1992 | Sansom et al. ............. 52/396.04 |
| 5,357,386 | 10/1994 | Haidari et al. ............. 360/97.02 |
| 5,384,448 | 1/1995 | Kubasko . |
| 5,483,743 | 1/1996 | Armogan et al. ........... 29/883 |
| 5,491,300 | 2/1996 | Huppenthal et al. ....... 174/151 |

FOREIGN PATENT DOCUMENTS

| 18208862 | 7/1982 | Germany ............... H05K 5/06 |
|---|---|---|

*Primary Examiner*—Kristine L. Kincaid
*Assistant Examiner*—Dhiru R. Patel
*Attorney, Agent, or Firm*—Albert K. Kau; Thomas A. Rendos

[57] ABSTRACT

Disclosed is a hermetically sealed housing assembly for protecting electrical equipment. The housing assembly includes a hermetically sealed housing member having an exterior wall and an interior region for containing the electrical equipment. A flex tape electrical signal conductor extends through an opening in the exterior wall, and transmits electrical signals between the electrical equipment in the interior region and electrical components in a region exterior to the housing member. The flex tape signal conductor is hermetically sealed to the exterior wall of the housing member at the opening to maintain the integrity of the hermetic seal of the housing member even after temperature-cycling for a period of time.

17 Claims, 6 Drawing Sheets

HERMETICALLY SEALED HOUSING HAVING A FLEX TAPE ELECTRICAL CONNECTOR

BACKGROUND OF THE INVENTION

This invention relates to hermetically sealed housings for protecting electrical equipment. In particular, the present invention is a hermetically sealed housing using a flex tape electrical connector to pass electrical signals between the interior and the exterior of the hermetically sealed housing. The flex tape electrical connector maintains the integrity of the hermetic seal of the housing while using non-hermetically sealed plug connectors.

In certain environments, it is necessary to isolate electrical equipment from the outside world. In many applications, this is accomplished by placing the electrical equipment and other necessary elements within some type of housing or container. The housing is then hermetically sealed to avoid any environmental contamination of the electrical equipment such as caused by humidity and/or undesired gases.

When using hermetically sealed housings, it is typically necessary to transmit electrical signals between the electrical equipment within the interior of the housing and electrical components exterior to the housing. These electrical signals, for example, may be power supplies, control signals or readout signals. Typically, electrical plug connectors are bonded or welded to the housing and are used to transmit these electrical signals between the interior and the exterior of the housing through a housing wall. In order to provide acceptable performance, the electrical plug connectors must adequately maintain the integrity of the hermetic seal of the housing. As such, expensive hermetically sealed electrical plug connectors are used.

Besides their high cost, a further problem with known hermetically sealed electrical plug connectors is their inability to maintain the integrity of their hermetic seal after they have been temperature-cycled for a period of time. Once the hermetic seal of an electrical plug connector begins to leak, undesired gases and humidity enter the housing causing operation of the electrical equipment within the interior of the housing to degrade. Many of the aforementioned leaks result from inadequate sealing techniques. For example, the use of incorrect sealants or potting materials, results in unnecessary stresses in the electrical plug connector due to a coefficient of thermal expansion (CTE) differential. Other inadequate sealing techniques occur when bubbles or voids are entrapped in the components during the sealing process. These voids contribute to a CTE differential as well as provide leak paths through the plug connectors. This CTE differential within the sealant, in conjunction with any inherent CTE differential within the electrical plug connector itself and/or between the electrical plug connector and the housing, causes stress fractures in the cured sealant during thermal cycling. These stress fractures result in leaks that ruin the integrity of the hermetic seal of the housing.

There is a need for improved hermetically sealed housings for electrical equipment. In particular, there is a need for an hermetically sealed housing using an electrical connector that will maintain the integrity of the hermetic seal of a housing even after having been temperature-cycled for a period of time.

SUMMARY OF THE INVENTION

The present invention is a hermetically sealed housing assembly for protecting electrical equipment. The housing assembly includes a hermetically sealed housing member having an exterior wall that defines an interior region for containing electrical equipment. Extending through the exterior wall is an opening that forms a passageway between the interior region and a region exterior to the housing member. An electrical connector device transmits electrical signals between electrical equipment in the interior region and electrical components in the region exterior to the housing member. The electrical connector device includes a flex tape electrical signal conductor that extends through the opening and is coupled to the electrical equipment and the electrical components. The flex tape electrical signal conductor is hermetically sealed to the exterior wall of the housing member at the opening. The hermetically sealed flex tape electrical signal conductor maintains the integrity of the hermetic seal of the housing member even after temperature-cycling for a period of time.

DETAILED DESCRIPTION OF THE PREFERRED EMBODIMENTS

Figure 1:
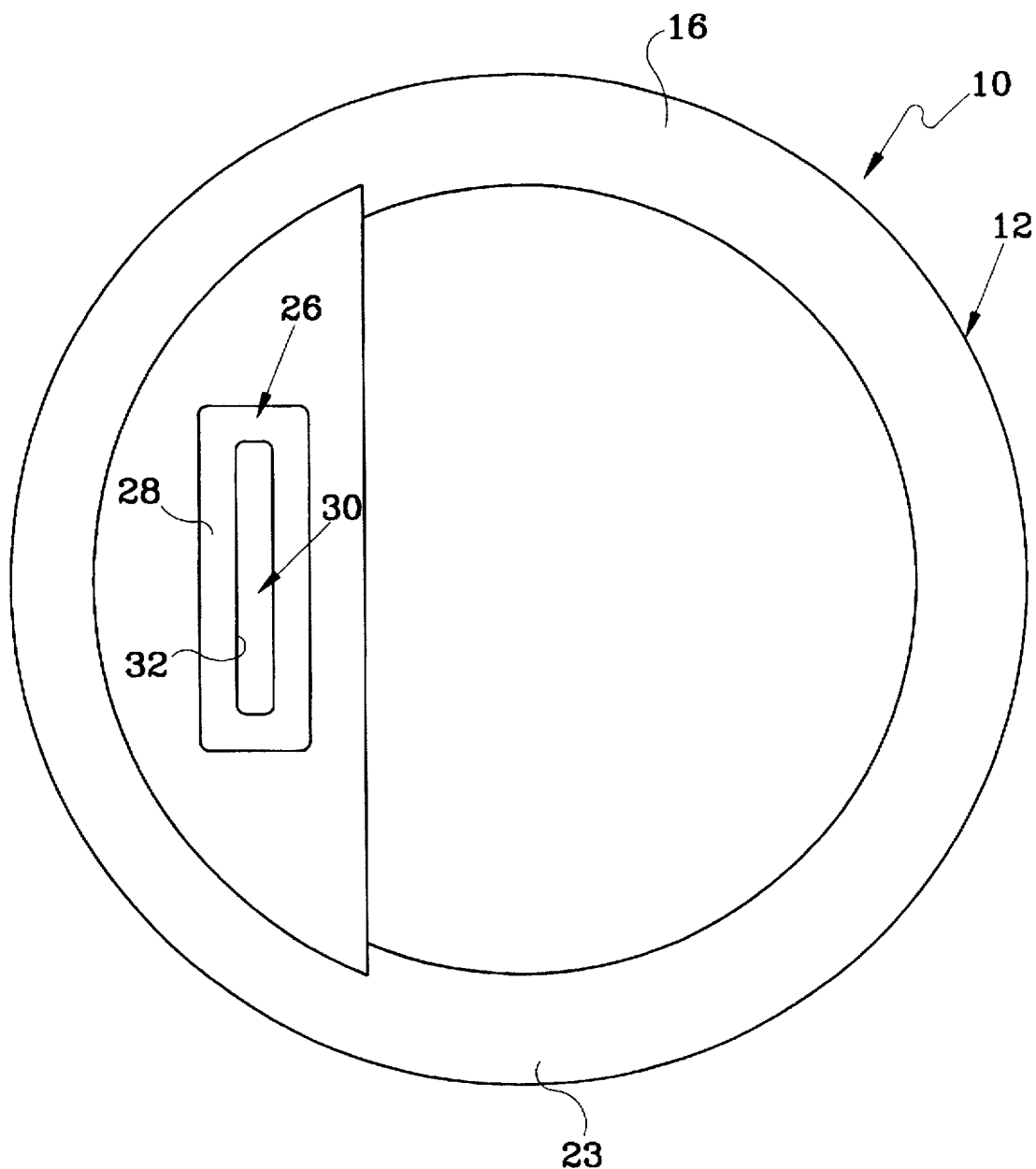
FIG. 1 is a top elevational view of a hermetically sealed housing in accordance with the present invention with the flex tape electrical connector removed therefrom for clarity.
Figure 2:
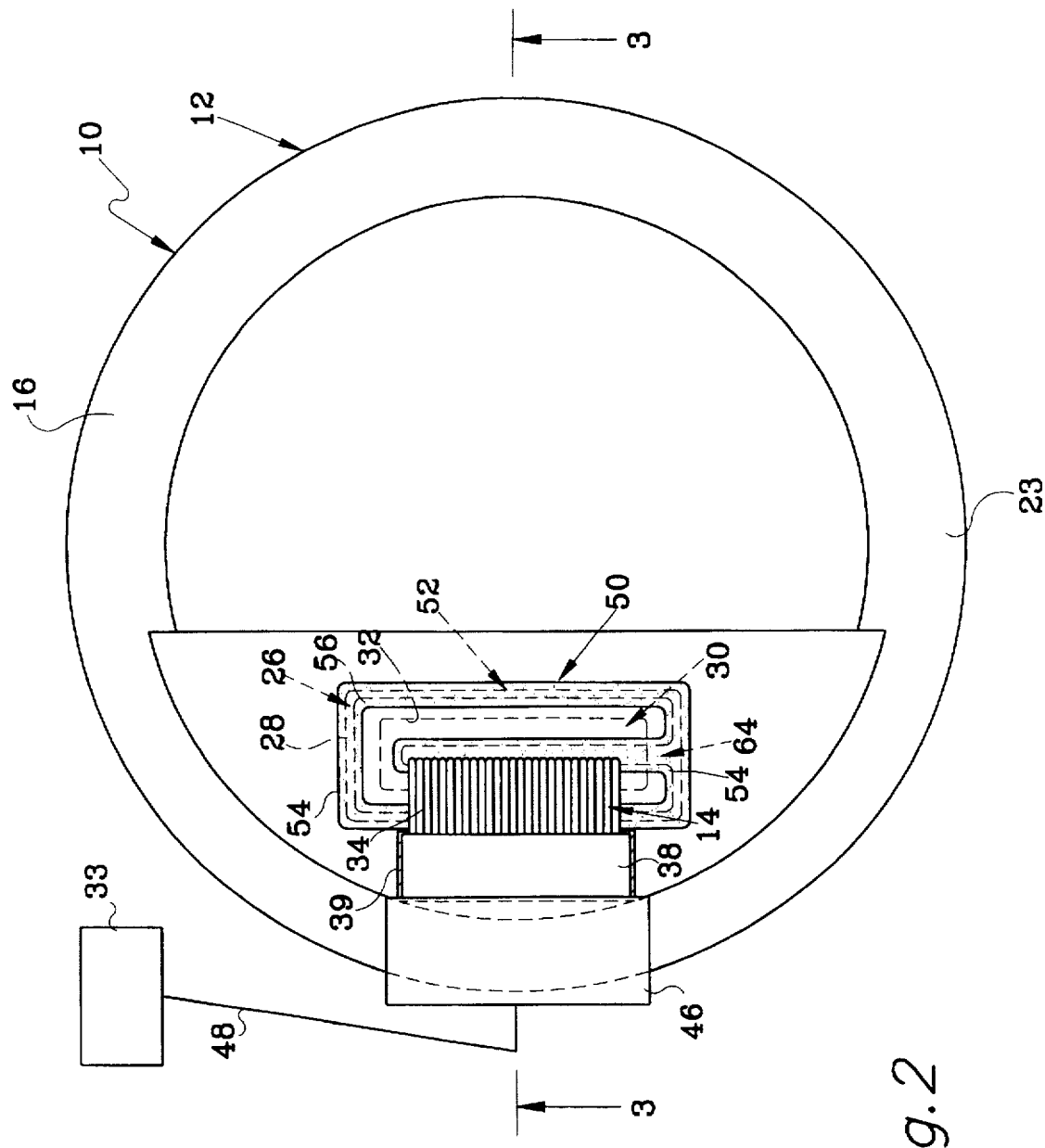
FIG. 2 is a top elevational view similar to FIG. 1 of the hermetically sealed housing with the flex tape electrical connector in accordance with the present invention.
Figure 3:
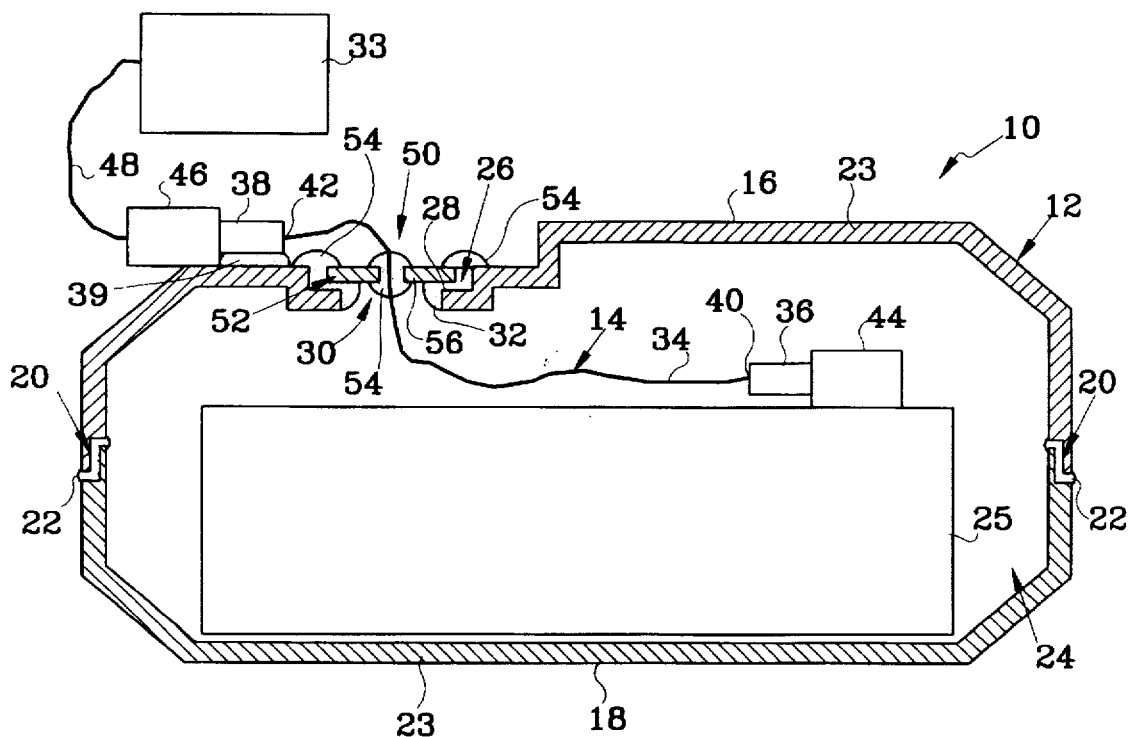
FIG. 3 is a sectional view of the hermetically sealed housing with the flex tape electrical connector taken along line 3—3 in FIG. 2.

A hermetically sealed housing assembly 10 in accordance with the present invention is illustrated generally in FIGS. 1–3. As seen best in FIG. 3, the sealed housing assembly 10 includes a hermetically sealed housing member 12 and a flex tape electrical connector device 14. The hermetically sealed housing member 12 is defined by a top cover element 16 and a bottom cover element 18. The top and bottom cover elements 16 and 18 are hermetically sealed together at a lap joint interconnect 20 by welding or an epoxy based adhesive 22. In one preferred embodiment, the top and bottom cover elements 16 and 18 are manufactured of aluminum, and Scotch-weld™ 2214 - High Temp, an epoxy based adhesive manufactured by Minnesota, Mining and Manufacturing Corporation of St. Paul, Minn. is used to hermetically seal the lap joint interconnect 20.

As seen best in FIG. 3, once the top and bottom cover elements 16 and 18 are hermetically sealed together, the top and bottom cover elements 16 and 18 together form an exterior wall 23 of the housing member 12. The exterior wall 23 defines an interior region 24 for housing electrical equipment 25. The hermetically sealed housing member 12 contains and protects the electrical equipment 25 from environmental contamination such as may be caused by humidity and/or undesired gases. The electrical equipment 25 is mounted within the interior region 24 of the housing member 12 prior to the lap joint interconnect 20 being hermetically sealed by the sealant 22. In one preferred embodiment, the electrical equipment 25 is a ring laser gyro and its associated electronics.

As seen best in FIGS. 1 and 3, the top cover element 16 of the housing member 12 has a rectangular shaped recessed region 26 defined by a portion of the exterior wall 23 that forms a circumferential ledge 28. The ledge 28 surrounds a rectangular shaped opening 30 that extends through the exterior wall 23 and forms a passageway between the interior region 24 and a region exterior to the housing member 12. The opening 30 has an edge wall 32.

The flex tape electrical connector device 14 transmits electrical signals between the electrical equipment 25 in the interior region 24 and electrical components 33 in the region exterior to the housing member 12. As seen in FIGS. 2 and 3, the flex tape electrical connector device 14 includes a flex tape electrical signal conductor 34 having first and second plug connectors 36 and 38, respectively. The first plug connector 36 is coupled to a first end 40 of the signal conductor 34, and the second plug connector 38 is coupled to a second opposite end 42 of the signal conductor 34. The first and second plug connectors 36 and 38 are non-hermetically sealed plug connectors. The second plug connector 38 is secured to the exterior wall 23 by an epoxy based adhesive 39 similar to adhesive 22.

In one preferred embodiment, the signal conductor 34 is a Polyimide flex tape with copper foil and an acrylic adhesive manufactured by Litchfield Precision, of Litchfield, Minn. and the first and second plug connectors 36 and 38 are non-hermetically sealed 28 pin micro D connectors or multipin custom connectors manufactured by ITT Cannon of Santa Anna Calif. or Microdot of South Pasadena Calif.

As seen best in FIG. 3, the signal conductor 34 extends through the opening 30 and is coupled between the electrical equipment 25 and the electrical components 33. To this end, the first plug connector 36 is releasably coupled to a corresponding mating plug connector 44 of the electrical equipment 25. In addition, the second plug connector 38 is releasably coupled to a comparable mating plug connector 46 connected to the electrical components 33 through signal lines 48. In one preferred embodiment, the electrical components 33 are other ring laser gyros and associated electronics of an inertial navigation system.

As seen best in FIGS. 2 and 3, in one preferred embodiment of the hermetically sealed housing assembly 10, the rectangular shaped opening 30 is dimensioned to allow passage of the first and second plug connectors 36 and 38 and the signal conductor 34. By dimensioning the opening 30 in this manner, the first and second plug connectors 36 and 38 can be assembled to the signal conductor 34 prior to the threading of the connector device 14 through the opening 30. It is to be understood that in the one preferred embodiment described above, that the first and second plug connectors 36 and 38 are identical, and that as such both the first plug connector 36 and the second plug connector 38 can pass through the opening 30. However, if the first plug connector 36 is not dimensionally identical to the second plug connector 38, the opening 30 could be dimensioned to allow the passage of the signal conductor 34 and only the first plug connector 36 or the second plug connector 38. This arrangement would still allow dimensionally dissimilar first and second plug connectors 36 and 38 to be assembled to the signal conductor 34 prior to the threading of the connector device 14 through the opening 30. In one preferred embodiment, the rectangular shaped opening 30 has a length of 1.25 inches and a width of 0.40 inches, while each of the first and second plug connectors 36 and 38 has a length of 1.20 inches, a width of 0.35 inches and a height of 0.40 inches.

Figure 4:
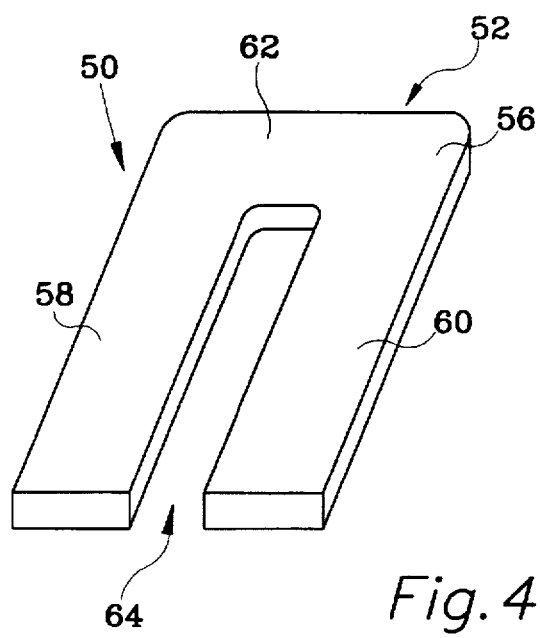
FIG. 4 is an enlarged perspective view of a U-shaped filler member shown in FIGS. 2 and 3.

As seen in FIGS. 2 and 3, a joining mechanism 50 secures the signal conductor 34 of the connector device 14 to the exterior wall 23 at the opening 30. The joining mechanism 50 hermetically seals the signal conductor 34 to the housing member 12 to define the hermetically sealed housing assembly 10. The joining mechanism 50 includes a filler element 52 and a sealant 54. As seen best in FIG. 4, the filler element 52 is a U-shaped member 56 (preferably manufactured of aluminum) having first and second legs 58 and 60, respectively, joined by a bight portion 62. The first and second legs 58 and 60 and the bight portion 62 define a slot 64 that is dimensioned to receive the signal conductor 34. As seen in FIGS. 2 and 3, circumferential ledge 28 is dimensioned to receive and support the U-shaped member 56 with a portion of the signal conductor 34 passing through the slot 64 and the opening 30. The U-shaped member 56 bridges some of the gaps between the edge wall 32 of the opening 30 and the signal conductor 34. These gaps being a result of the use of the oversized opening 30, which is dimensioned so as to allow passage therethrough not only of the signal conductor 34, but also the larger first and second plug connectors 36 and 38. In one preferred embodiment, the slot 64 has a length of 0.85 inches and a width of 0.05 inches to receive the signal conductor 34 which has a length of 0.80 inches and a width of 0.01 inches.

The sealant 54, as best seen in FIGS. 2 and 3, hermetically seals the signal conductor 34 to the U-shaped member 56, and hermetically seals the U-shaped member 56 to the edge wall 32 of the opening 30 in the exterior wall 23. Hermetically sealing the signal conductor 34 to the U-shaped member 56 and the U-shaped member 56 to the housing member 12, creates a hermetically sealed housing assembly 10 that protects electrical equipment 25 from environmental contamination that may be caused by humidity and/or undesired gases entering the housing member 12.

The sealant 54 is a high temperature resistant compound having high lap shear adhesion properties to ensure strong adhesion to the signal conductor 34, the U-shaped member 56 and the exterior wall 23. In addition, the sealant 54 exhibits a uniform coefficient of thermal expansion (CTE) throughout the sealing compound. This uniform CTE ensures consistent thermal expansion and contraction throughout the cured sealant 54 during temperature-cycling. Consistent thermal expansion and contraction throughout the cured sealant 54 virtually eliminates stress fractures in the cured sealant caused by temperature cycling. By virtually eliminating stress fractures in the cured sealant, leaks that ruin the integrity of the hermetic seal of the housing assembly 10 are also essentially eliminated.

Examples of the type of compound used for the sealant 54 are Scotch-weld™ 2214 a product of Minnesota, Mining and Manufacturing Corporation of St. Paul, Minn., and Scotch-weld™ 2216 with Cabosil® both products of Minnesota, Mining and Manufacturing Corporation of St. Paul, Minn. In one preferred embodiment, Scotch-weld™ 2214 was used as the sealant 54 and was allowed to oven cure per the manufacturer's recommendations for one hour at a temperature of 250° F. to create a hermetic seal that can maintain leak rates below $1 \times 10^{-7}$ atm. cm.$^3$/sec. at a pressure differential of 1 atm. when exposed to temperature cycles ranging from −65° F. to 230° F. Alternatively, Scotch-weld™ 2216 with Cabosil® was used as the sealant 54 and was allowed to oven cure per the manufacturer's recommendations for twenty-four hours at a room temperature of) 77° F. to create a hermetic seal that could also maintain leak rates below $1 \times 10^{-5}$ atm. cm.$^3$/sec. at a pressure differential of 1 atm. when exposed to temperature cycles ranging from −65° F. to 230° F.

Figure 5:
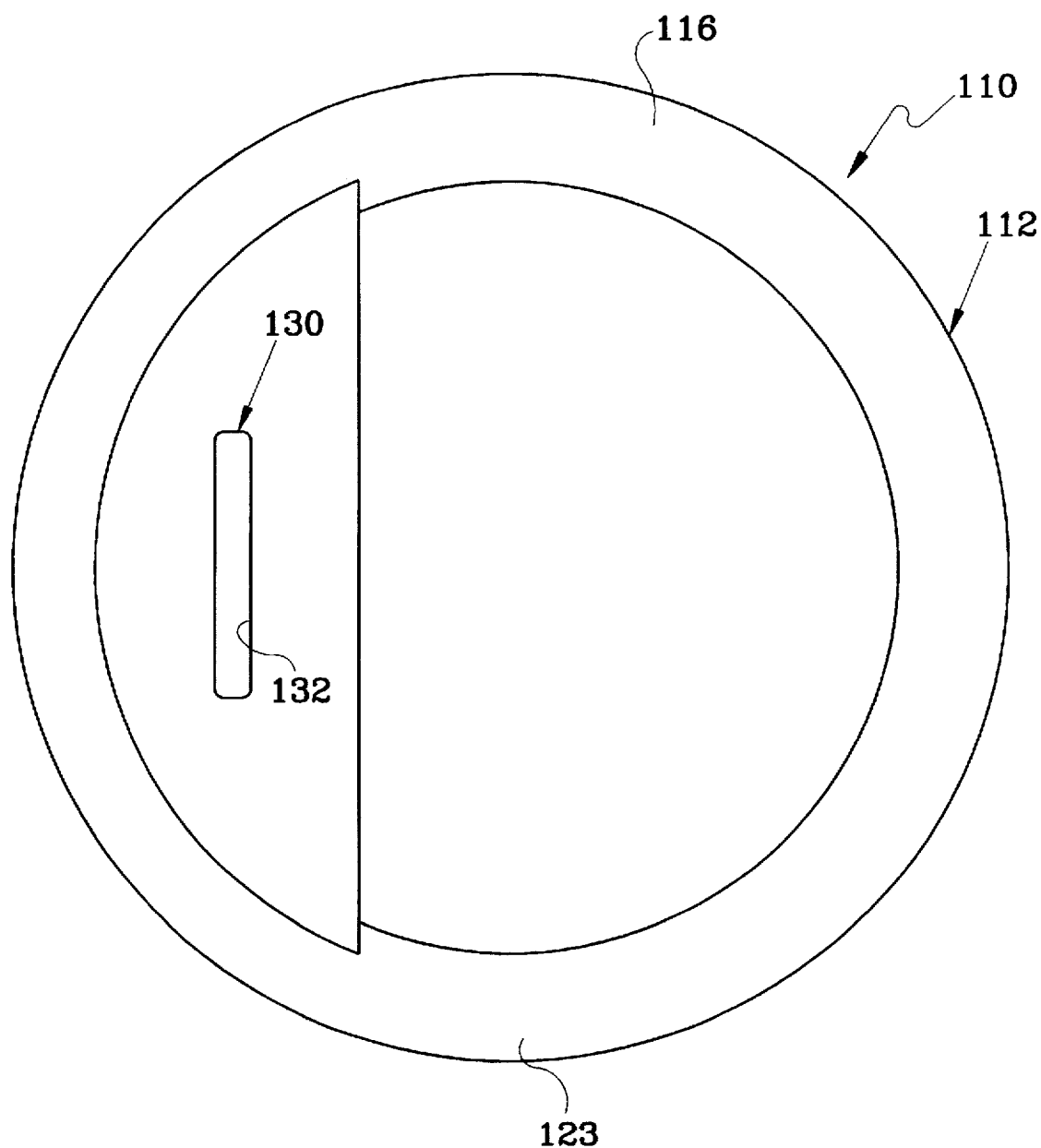
FIG. 5 is a top elevational view of an alternative embodiment of a hermetically sealed housing in accordance with the present invention with the flex tape electrical connector removed therefrom for clarity.
Figure 6:
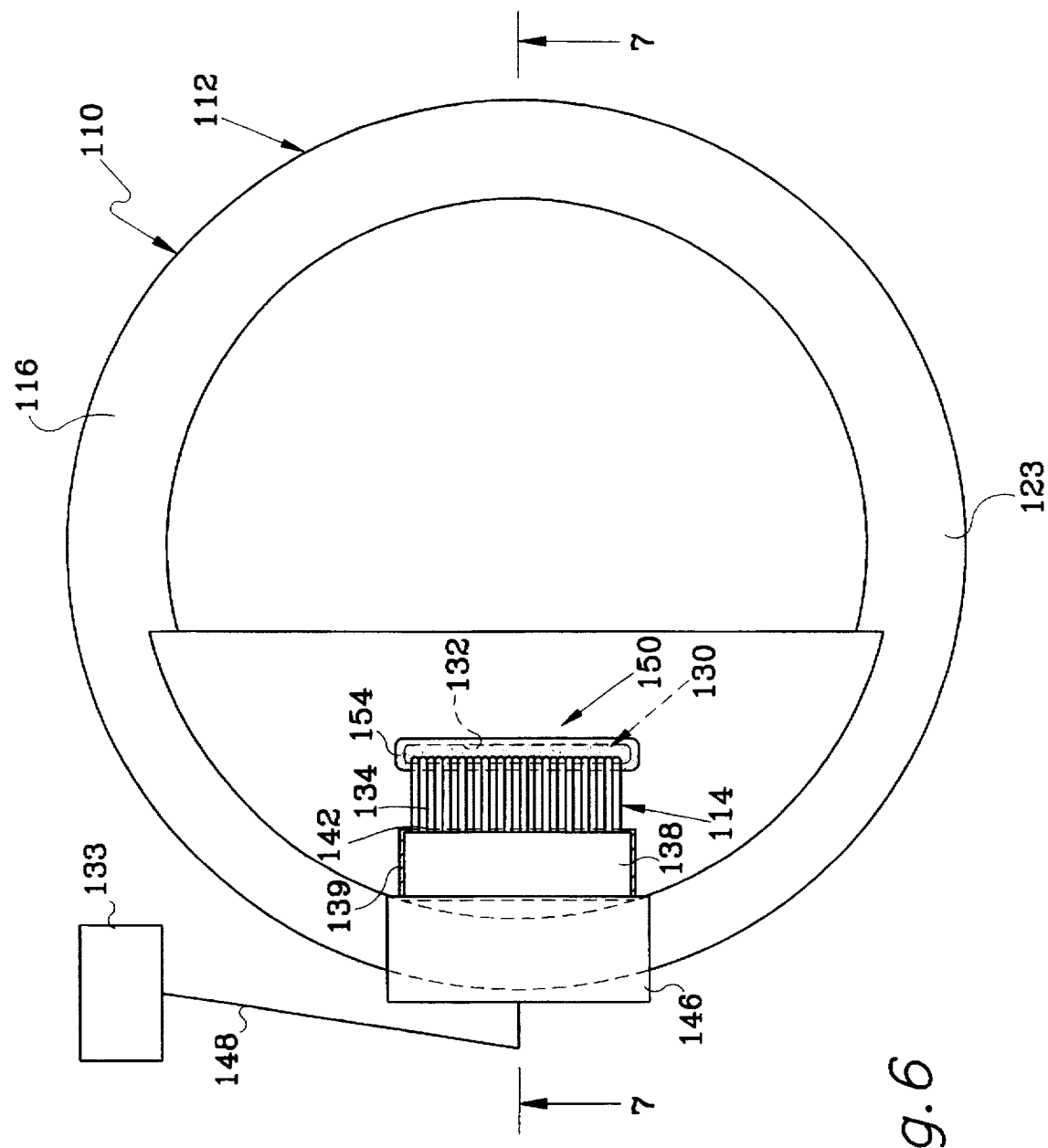
FIG. 6 is a top elevational view similar to FIG. 5 of the alternative embodiment of the hermetically sealed housing with the flex tape electrical connector in accordance with the present invention.
Figure 7:
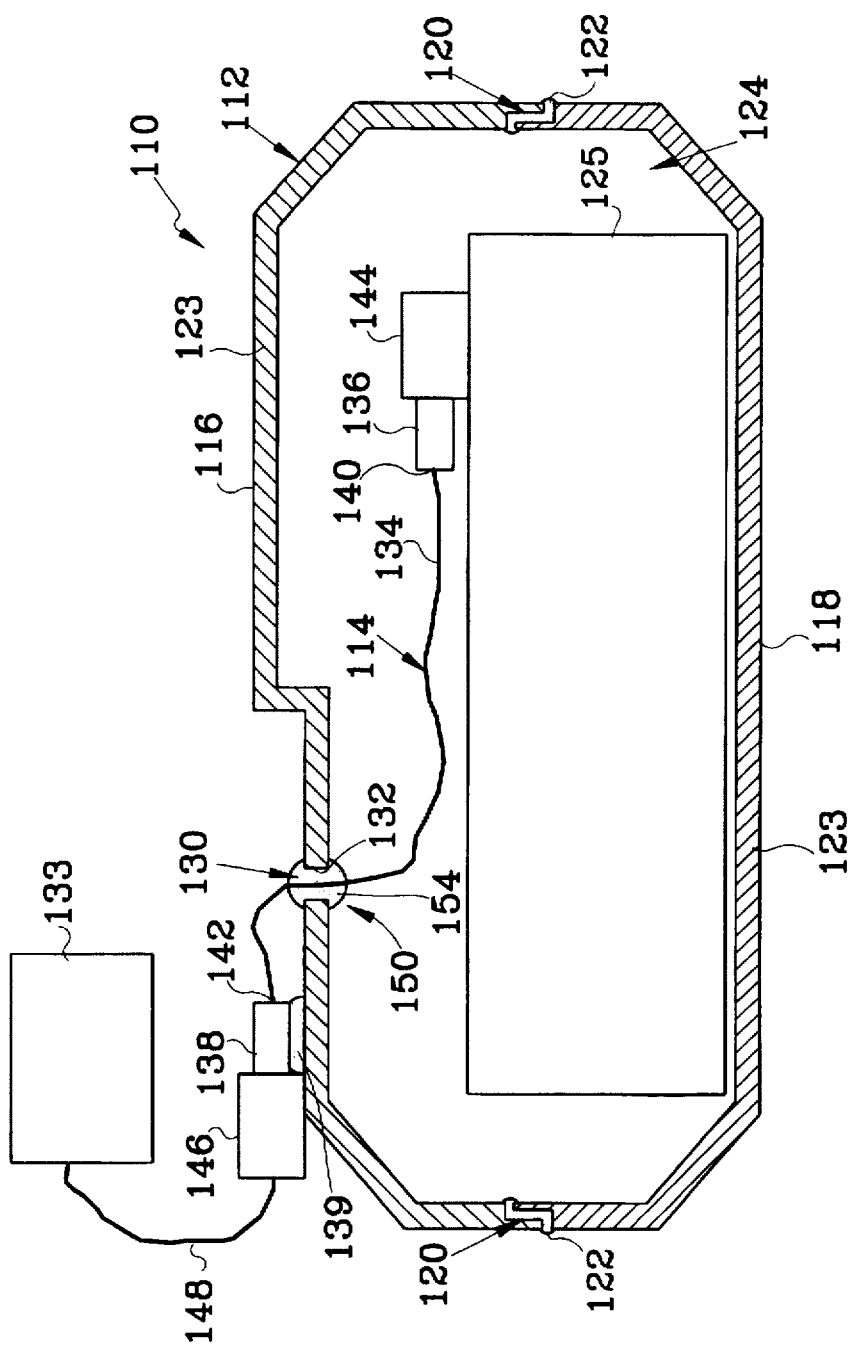
FIG. 7 is a sectional view of the alternative embodiment of the hermetically sealed housing with the flex tape electrical connector taken along line 7—7 in FIG. 6.

FIGS. 5–7 illustrate an alternative embodiment of the hermetically sealed housing assembly 110. Like parts are labeled with like numerals except for the addition of the prescript 1. In the housing assembly 110, the rectangular shaped recessed region 26, the circumferential ledge 28 and the filler element 52 have been eliminated. In addition, the rectangular shaped opening 30 has been replaced by elongated opening 130. The elongated opening 130 is dimensioned to only allow passage therethrough of the signal conductor 134 and not the first and second plug connectors 136 and 138. By dimensioning the elongated opening 130 in this manner, the first plug connector 136 or the second plug connector 138 (or both the first and second plug connectors 136 and 138) needs to be assembled to the signal conductor 134 after the signal conductor 134 is threaded through the opening 130. It is to be understood that in the alternative embodiment described above, that whether the first and second plug connectors 136 and 138 are identical or dissimilar, that at least one of the first and second plug connectors 136 and 138 will have to be assembled to the signal conductor 134 after the signal conductor 134 is threaded through the opening 130. In one preferred embodiment, the elongated opening 130 has a length of 0.85 inches and a width of 0.05 inches, while the signal conductor 134 has a length of 0.80 inches and a width of 0.01 inches. As can be seen in FIGS. 6 and 7, the sealant 154 hermetically seals the signal conductor 134 directly to the edge wall 132 of the opening 130 in the exterior wall 123.

The combination of the housing member 12, 112, the connector device 14, 114 and the joining mechanism 50, 150 creates a hermetically sealed housing assembly 10, 110 that is capable of maintaining the integrity of the hermetic seal even after temperature-cycling for a period of time.

Although the present invention has been described with reference to preferred embodiments, workers skilled in the art will recognize that changes may be made in form and detail without departing from the spirit and scope of the invention.

We claim:

1. A hermetically sealed housing assembly for protecting electrical equipment, comprising:

a hermetically sealed housing member having an exterior wall defining an interior region for containing electrical equipment, the exterior wall having an opening extending therethrough that forms a passageway between the interior region and a region exterior to the housing member; and an electrical connector device for transmitting electrical signals between electrical equipment in the interior region and electrical components in the region exterior to the housing member, the electrical connector device including:

a flex tape electrical signal conductor that extends through the opening and is coupled to said electrical equipment in the interior region and to said electrical components in the region exterior to the housing member; and means joining the flex tape electrical signal conductor to the exterior wall at the opening to hermetically seal the conductor to the housing member to define the hermetically sealed housing assembly including:

an epoxy sealant; and a filler element that bridges any gaps among an edge wall of the opening in the exterior wall of the housing member, the flex tape electrical signal conductor, and the sealant; and wherein the sealant hermetically seals the flex tape conductor to the filler element and the filler element to the edge wall of the opening in the exterior wall of the housing member to define the hermetically sealed housing assembly.

2. The housing assembly of claim 1 wherein the flex tape electrical signal conductor has a first end and an opposite second end, the first end including a plug connector for mating with a corresponding plug connector of one of said electrical equipment and said electrical components.

3. The housing assembly of claim 2 wherein the second end of the flex tape electrical signal conductor includes a further plug connector for mating with a corresponding further plug connector of the other one of said electrical equipment and said electrical components.

4. The housing assembly of claim 1 wherein the flex tape electrical signal conductor includes:

a first plug connector coupled to a first end of the conductor, the first plug connector being capable of mating with a corresponding plug connector of said electrical equipment in the interior region of the housing member; and a second plug connector coupled to a second end of the conductor, the second plug connector being capable of mating with a comparable plug connector of said electrical components in the region exterior to the housing member.

5. The housing assembly of claim 4 wherein the opening extending through the exterior wall of the housing member is dimensioned to only allow passage of the flex tape electrical signal conductor therethrough.

6. The housing assembly of claim 4 wherein the opening extending through the exterior wall of the housing member is dimensioned to allow passage therethrough of the flex tape electrical signal conductor and at least one of the first and second plug connectors.

7. The housing assembly of claim 6 wherein the opening is dimensioned to allow passage of the first plug connector.

8. The housing assembly of claim 6 wherein the opening is dimensioned to allow passage of the second plug connector.

9. The housing assembly of claim 6 wherein the opening is dimensioned to allow passage of both the first and second plug connectors.

10. The housing assembly of claim 1 wherein the opening extending through the exterior wall of the housing member is dimensioned to only allow passage of the flex tape electrical signal conductor therethrough.

11. The housing assembly of claim 1 wherein the sealant is a high temperature resistant sealing compound with high lap shear adhesion properties.

12. The housing assembly of claim 11 wherein the sealant is an one-component curing epoxy sealant.

13. The housing assembly of claim 11 wherein the sealant is a two-component flexible epoxy sealant with a fumed silicone dioxide.

14. The housing assembly of claim 1 wherein the filler element is a U-shaped member having first and second legs joined by a bight portion that define a slot for the flex tape conductor, and wherein the sealant hermetically seals the flex tape conductor to the U-shaped member and the U-shaped member to the edge wall of the opening in the exterior wall of the housing member to define the hermetically sealed housing assembly.

15. The housing assembly of claim 14 wherein the sealant is a high temperature resistant sealing compound with high lap shear adhesion properties.

16. The housing assembly of claim 15 wherein the sealant is an one-component curing epoxy sealant.

17. The housing assembly of claim 15 wherein the sealant is a two-component flexible epoxy sealant with a fumed silicone dioxide.

* * * * *